United States Patent

Shiokawa et al.

(10) Patent No.: US 10,193,061 B2
(45) Date of Patent: Jan. 29, 2019

(54) SPIN-ORBIT TORQUE MAGNETIZATION ROTATIONAL ELEMENT

(71) Applicant: TDK CORPORATION, Tokyo (JP)

(72) Inventors: Yohei Shiokawa, Tokyo (JP); Tomoyuki Sasaki, Tokyo (JP); Tohru Oikawa, Tokyo (JP)

(73) Assignee: TDK CORPORATION, Tokyo (JP)

( * ) Notice: Subject to any disclaimer, the term of this patent is extended or adjusted under 35 U.S.C. 154(b) by 0 days.

(21) Appl. No.: 15/793,523

(22) Filed: Oct. 25, 2017

(65) Prior Publication Data

US 2018/0123028 A1 May 3, 2018

(30) Foreign Application Priority Data

Oct. 27, 2016 (JP) .................................. 2016-210532

(51) Int. Cl.
| | |
|---|---|
| *H01L 43/08* | (2006.01) |
| *H01L 43/10* | (2006.01) |
| *H01F 10/32* | (2006.01) |
| *H01L 43/04* | (2006.01) |
| *H01L 43/06* | (2006.01) |

(52) U.S. Cl.
CPC ............ *H01L 43/08* (2013.01); *H01F 10/324* (2013.01); *H01L 43/04* (2013.01); *H01L 43/06* (2013.01); *H01L 43/10* (2013.01)

(58) Field of Classification Search
CPC ......... H01L 43/02; H01L 43/04; H01L 43/06; H01L 43/08; H01L 43/10; G11C 11/14–11/16; G11C 11/161; G11C 11/18
See application file for complete search history.

(56) References Cited

U.S. PATENT DOCUMENTS

| | | | |
|---|---|---|---|
| 9,130,155 B2* | 9/2015 | Chepulskyy | ............ H01L 43/08 |
| 2015/0348606 A1 | 12/2015 | Buhrman et al. | |
| 2017/0076769 A1* | 3/2017 | Shirotori | ............... G11C 11/161 |
| 2017/0222135 A1 | 8/2017 | Fukami et al. | |

FOREIGN PATENT DOCUMENTS

WO 2016/021468 A1 2/2016

OTHER PUBLICATIONS

Fukami et al., "A spin-orbit torque switching scheme with collinear magnetic easy axis and current configuration," Nature Nanotechnology, Mar. 2016, pp. 1-6.
Emori et al., "Interfacial spin-orbit torque without bulk spin-orbit coupling," Physical Review B, 2016, vol. 93, 180402 (R), pp. 1-5.
"AtomWork," Inorganic Material Database, [URL:http://crystdb.nims.go.jp/].
Xu et al., "Inorganic Materials Database for Exploring the Nature of Material," Japanese Journal of Applied Physics, 2011, vol. 50, 11RH02, pp. 1-5.
Seo et al., "Area-Efficient SOT-MRAM With a Schottky Diode," IEEE Electron Device Letters, Aug. 2016, vol. 37, No. 8, pp. 982-985.

* cited by examiner

*Primary Examiner* — Allison Bernstein
(74) *Attorney, Agent, or Firm* — Oliff PLC

(57) ABSTRACT

A spin-orbit torque magnetization rotational element includes: a ferromagnetic metal layer, a magnetization direction of which is configured to be changed; a spin-orbit torque wiring bonded to the ferromagnetic metal layer; and an interfacial distortion supply layer bonded to a surface of the spin-orbit torque wiring on a side opposite to the ferromagnetic metal layer.

22 Claims, 6 Drawing Sheets

SPIN-ORBIT TORQUE MAGNETIZATION ROTATIONAL ELEMENT

BACKGROUND OF THE INVENTION

Technical Field

The present invention relates to a spin-orbit torque magnetization rotational element and a magnetic memory.

The present invention relates to a magnetoresistance effect element. Priority is claimed on Japanese Patent Application No. 2016-210532, filed Oct. 27, 2016, the content of which is incorporated herein by reference.

Description of Related Art

A giant magnetoresistive (GMR) element including a multilayered film of a ferromagnetic layer and a nonmagnetic layer and a tunneling magnetoresistance (TMR) element using an insulating layer (a tunnel barrier layer, a barrier layer) in a nonmagnetic layer are known. Generally, the TMR element has a higher element resistance than the GMR element. However, the TMR element has a larger MR ratio than the GMR element. Therefore, TMR elements are of interest as elements for magnetic sensors, high frequency components, magnetic heads and nonvolatile random access memories (MRAM).

The MRAM reads and writes data by utilizing the property that the element resistance of the TMR element varies when the directions of magnetization of the two ferromagnetic layers sandwiching the insulating layer are changed. As a writing method of MRAM, a method in which writing (magnetization inversion) is performed by utilizing a magnetic field generated by a current; and a method in which writing (magnetization inversion) is performed by utilizing a spin transfer torque (STT) generated by applying current in a lamination direction of a magnetoresistance effect element, are known.

Although the magnetization rotation of the TMR element using STT is efficient from the viewpoint of energy efficiency, the switching current density for magnetization rotation is high. From the viewpoint of the long life of the TMR element, it is desirable that the switching current density is low. This also applies to the GMR element.

In recent years, interest has been focused on magnetization rotation utilizing a pure spin current generated by spin-orbit interaction as means for reducing the reversal current (for example, S. Fukami, T. Anekawa, C. Zhang and H. Ohno, Nature Nanotechnology, DOI: 10.1038/NNANO.2016.29).

Although this mechanism has not been fully clarified yet, it is believed that the pure spin current caused by spin-orbital interaction or Rashba effect at the interface of dissimilar materials induces spin-orbit torque (SOT) for the magnetization rotation to occur.

Pure spin current is generated by the same number of electrons of upward spin and downward spin electrons flowing in opposite directions, and the flow of electric charge is canceled out. Therefore, the current flowing through the magnetoresistance effect element is zero. Accordingly, it is expected that the service life of the magnetoresistance effect element is prolonged.

Further, it is believed that the required current density due to the Rashba effect in the magnetization rotation by SOT is equivalent to the reversal current density required for magnetization rotation by STT (for example, S. Emori, T. Nan, A. M. Belkessam, X. Wang, A. D. Matyushov, C. J. Babroski, Y. Gao, H. Lin and N. X. Sun, Physical Review B (2016). DOI: 10.1103/Phys Rev. B.93.180402).

SUMMARY OF THE INVENTION

However, in order to perform magnetization rotation only with SOT, it is believed that it is necessary to apply a magnetic field or the like from the outside to give a trigger for magnetization rotation. This is because it is difficult to impart sufficient torque for magnetization only with the SOT to be developed. Therefore, it is required to develop larger SOT.

The present invention has been made in view of the above problems, and it is an object of the present invention to provide a spin-orbit torque magnetization rotational element capable of easily reversing magnetization.

Although the cause of SOT development is not clear enough yet, it is thought that there are internal factors and external factors roughly divided.

The internal factor is caused by the material itself constituting the spin-orbit torque wiring. For example, there are those caused by material species used for the spin-orbit torque wiring, those caused by the crystal structure of the spin-orbit torque wiring, and the like.

On the other hand, external factors are caused by externally applied actions, other than internal factors. For example, there are those caused by scattering factors such as impurities contained in the spin-orbit torque wiring, those caused by the interface between the spin-orbit torque wiring and other layers, and the like.

The inventors of the present invention focused attention on the cause attributable to the interface between the spin-orbit torque wiring and the other layers among the various development causes. By applying distortion to the interface, we have found that "inner field arising from the distortion" in the spin-orbit torque wiring can be produced and a larger SOT can be developed.

In TMR elements and the like using STT, it is usual to perform crystal growth so as not to cause distortion at the crystal interface. This is for decreasing the resistance value in the stacking direction of the TMR element and reducing the bias voltage applied to the TMR element. In this manner, applying distortion to the crystal interface is a configuration which is usually avoided in spin-based devices and opens a new direction of the spin-orbit torque type magnetization rotation device.

(1) A spin-orbit torque magnetization rotational element related to the first aspect of the present invention is a spin-orbit torque magnetization rotational element including: a ferromagnetic metal layer, a magnetization direction of which is configured to be changed; a spin-orbit torque wiring bonded to the ferromagnetic metal layer; and an interfacial distortion supply layer bonded to a surface of the spin-orbit torque wiring on a side opposite to the ferromagnetic metal layer.

(2) In the spin-orbit torque magnetization rotational element according to the above-described first aspect, a degree of lattice mismatching between the spin-orbit torque wiring and the interfacial distortion supply layer may be 5% or more.

(3) In the spin-orbit torque magnetization rotational element according to the above-described first aspect, a degree of lattice mismatching between the spin-orbit torque wiring and the interfacial distortion supply layer may be 5% or more and 10% or less.

(4) In the spin-orbit torque magnetization rotational element according to the above-described first aspect, the spin-orbit torque wiring may have an fcc crystal structure, and the interfacial distortion supply layer may have any one of a NaCl structure, a corundum structure and a rutile structure.

(5) In the spin-orbit torque magnetization rotational element according to the above-described first aspect, the spin-orbit torque wiring may have a bcc crystal structure, and the interfacial distortion supply layer may have any one of a NaCl structure, a corundum structure, a rutile structure and a spinel structure.

(6) In the spin-orbit torque magnetization rotational element according to the above-described first aspect, the spin-orbit torque wiring may have a hcp structure, and the interfacial distortion supply layer may have a corundum structure.

(7) In the spin-orbit torque magnetization rotational element according to the above-described first aspect, the interfacial distortion supply layer may be an insulator.

(8) In the spin-orbit torque magnetization rotational element according to the above-described first aspect, the interfacial distortion supply layer may be a conductor having a thickness of 1 nm or less.

(9) In the spin-orbit torque magnetization rotational element according to the above-described first aspect, a thickness of the spin-orbit torque wiring may be twice or less of a spin diffusion length of a material constituting the spin-orbit wiring.

(10) The spin-orbit torque magnetization rotational element according to the above-described first aspect may further include, a non-magnetic layer and a fixed layer, in which a magnetization direction is fixed, on a surface of the ferromagnetic metal layer on a side opposite to the spin-orbit torque wiring.

(11) A magnetic memory related to the second aspect of the present invention is a magnetic memory using the spin-orbit torque magnetization rotational element according to the above-described first aspect.

According to the present invention, it is possible to provide a spin-orbit torque magnetization rotational element capable of easily reversing the magnetization direction of the ferromagnetic layer.

DETAILED DESCRIPTION OF THE INVENTION

Figure 1:
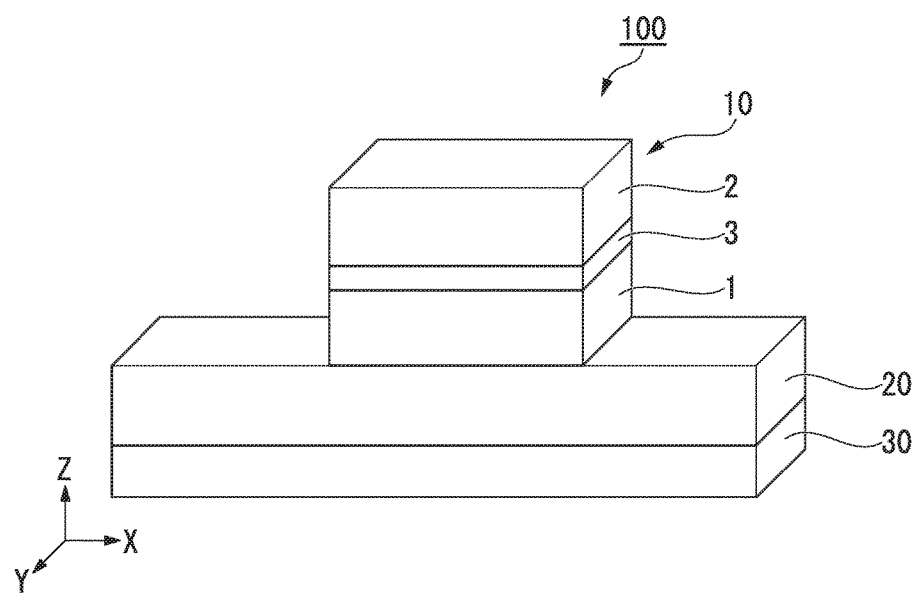
FIG. 1 is a schematic diagram of a spin-orbit torque magnetization rotational element according to an embodiment.

Hereinafter, embodiments of the present invention will be described in detail with reference to the accompanying drawings. In the description of the drawings, the same elements are denoted by the same reference numerals, and duplicate descriptions are omitted.

(Spin Orbital Torque Type Magnetization Rotational Element)

FIG. 1 is a perspective view schematically showing a spin-orbit torque magnetization rotational element according to a first embodiment.

The spin-orbit torque magnetization rotational element 100 according to the first embodiment has a magnetoresistive effect element 10, a spin-orbit torque wiring 20, and an interfacial distortion supply layer 30.

Hereinafter, the lamination direction of the magnetoresistance effect element 10 will be referred to as the z direction, the first direction in which the spin-orbit torque wiring 20 extends will be referred to as the x direction, the second direction orthogonal to both the z direction and the x direction will be referred to as the y direction.

<Magnetoresistive Element>

The magnetoresistance effect element 10 comprises a first ferromagnetic metal layer 1 whose magnetization direction is configured to change, a second ferromagnetic metal layer 2 whose magnetization direction is fixed, and a nonmagnetic layer 3 sandwiched between the first ferromagnetic metal layer 1 and the second ferromagnetic metal layer 2.

The magnetoresistance effect element 10 functions by the magnetization of the second ferromagnetic metal layer 2 being fixed in one direction and the magnetization direction of the first ferromagnetic metal layer 1 being relatively changed. When applied to a coercivity-differed type MRAM (pseudo spin valve type), the coercivity of the first ferromagnetic metal layer is larger than the coercivity of the second ferromagnetic metal layer. When applied to an exchange bias type MRAM (spin valve type), the magnetization direction of the first ferromagnetic metal layer is fixed by exchange coupling with the antiferromagnetic layer.

The magnetoresistance effect element 10 is a tunneling magnetoresistance (TMR) element when the nonmagnetic layer 3 is made of an insulator, and when the nonmagnetic layer 3 is made of a metal, a giant magnetoresistance (GMR: Giant Magnetoresistance) element.

As the layered structure of the magnetoresistance effect element, one of known laminate structures of magnetoresistive effect elements can be used. For example, each layer may be composed of a plurality of layers or another layer such as an antiferromagnetic layer for fixing the magnetization direction of the second ferromagnetic metal layer 2. The second ferromagnetic metal layer 2 is called a fixed layer or a reference layer, and the first ferromagnetic metal layer 1 is called a free layer, a memory layer, or the like.

A ferromagnetic material is applied as the material of the first ferromagnetic metal layer 1 and the second ferromagnetic metal layer 2.

For example, metals selected from the group consisting of Cr, Mn, Co, Fe and Ni; alloys containing at least one metal selected from these groups; or alloys including one or more metals selected therefrom and at least one element of B, C, and N. Specifically, Co—Fe, Co—Fe—B, and Ni—Fe can be as examples of these materials.

As the material of the first ferromagnetic metal layer 1 and the second ferromagnetic metal layer 2, a Heusler alloy such as $Co_2FeSi$ can be used. The Heusler alloy has a high spin polarizability and can realize a high MR ratio. The Heusler alloy contains an intermetallic compound having a chemical composition of $X_2YZ$. X is a transition metal element or a noble metal element of Co, Fe, Ni, or Cu group in the periodic table. Y is a transition metal of Mn, V, Cr or Ti group, and it can also be element species of X.

Z is a typical element of the group III to group V. For example, $Co_2FeSi$, $Co_2MnSi$, $Co_2Mn_{1-a}Fe_aAl_bSi_{1-b}$ and the like can be named as examples.

In the case where the directions of magnetization of the first ferromagnetic metal layer 1 and the second ferromagnetic metal layer 2 are perpendicular to the lamination surface, it is preferable to set the ferromagnetic material to 3 nm or less. Perpendicular magnetic anisotropy can be added to the first ferromagnetic metal layer 1 and the second ferromagnetic metal layer 2 at the interface with the non-magnetic layer 3. In addition, since the effect of the perpendicular magnetic anisotropy is attenuated by increasing the film thickness of the first ferromagnetic metal layer 1 and the second ferromagnetic metal layer 2, it is preferable that the thickness of the first ferromagnetic layer 1 and the second ferromagnetic layer 2 are as thin as possible.

In order to further increase the coercivity of the second ferromagnetic metal layer 2 with respect to the first ferromagnetic metal layer 1, an antiferromagnetic material such as IrMn or PtMn may be used as a material in contact with the second ferromagnetic metal layer 2. Furthermore, in order to prevent the leakage magnetic field of the second ferromagnetic metal layer 2 from affecting the first ferromagnetic metal layer 1, a synthetic ferromagnetic coupling structure may be used.

Furthermore, when the magnetization direction of the second ferromagnetic metal layer 2 is made perpendicular to the lamination surface, it is preferable to use a laminated film of Co and Pt. Specifically, the second ferromagnetic metal layer 2 may be FeB (1.0 nm)/Ta (0.2 nm)/[Pt (0.16 nm)/Co (0.16 nm)]$_4$/Ru (0.9 nm)/[Co (0.24 nm)/Pt (0.16 nm)]$_6$ in order from the nonmagnetic layer 3 side.

For the nonmagnetic layer 3, one of known materials can be used.

For example, when the nonmagnetic layer 3 is made of an insulator (in the case of a tunnel barrier layer), $Al_2O_3$, $SiO_2$, MgO, $MgAl_2O_4$, or the like can be used as a material thereof. In addition to these materials, a material in which a part of Al, Si, Mg is substituted with Zn, Be or the like can also be used. Among them, since MgO and $MgAl_2O_4$ are materials that can realize coherent tunneling, spin can be efficiently injected.

When the nonmagnetic layer 3 is made of a metal, Cu, Au, Ag, or the like can be used as the material thereof.

In addition, the magnetoresistance effect element 10 may have other layers. For example, a cap layer may be provided on the surface of the second ferromagnetic metal layer 2 on the side opposite to the non-magnetic layer 3, or an under layer may be provided on the surface of the first ferromagnetic metal layer 1 on the side opposite to the non-magnetic layer 3.

It is preferable that the layer disposed between the spin-orbit torque wiring 20 and the magnetoresistance effect element 10 does not dissipate the spin propagating from the spin-orbit torque wiring 20. For example, it is known that silver, copper, magnesium, aluminum and the like have a long spin diffusion length of 100 nm or more, and spin hardly dissipates.

The thickness of this layer is preferably not more than the spin diffusion length of the material constituting the layer. If the thickness of the layer is equal to or smaller than the spin diffusion length, the spin propagating from the spin-orbit torque wiring 20 can be sufficiently transferred to the magnetoresistance effect element 10.

The laminate including the first ferromagnetic metal layer 1, the nonmagnetic layer 3 and the second ferromagnetic metal layer 2 constituting the magnetoresistance effect element 10 has a columnar shape. The shape of the laminate in a plan view can take various shapes such as a circle, a square, a triangle, a polygon, and the like. From the viewpoint of thermal stability of magnetization, a circular shape having excellent symmetry is preferable, and in terms of easy magnetization rotation, an ellipse, a rectangle, or the like having anisotropy in one direction is preferable.

The maximum diameter of the laminate is preferably 80 nm or less, more preferably 60 nm or less, further preferably 30 nm or less. Here, the maximum diameter is a diameter when the laminate is circular in a plan view and a major axis diameter when it has anisotropy.

When the maximum diameter is 80 nm or less, it is difficult for the domain structure to be formed in the ferromagnetic metal layer, and it is unnecessary to take into account a component different from the spin polarization in the ferromagnetic metal layer. Further, when the thickness is 30 nm or less, a single domain structure is formed in the ferromagnetic metal layer, and the magnetization rotation rate and the probability are improved. Further, there is a strong demand for reducing the resistance in miniaturized magnetoresistive effect elements.

<Spin-Orbit Torque Wiring>

The spin-orbit torque wiring 20 is connected to one surface in the z direction of the first ferromagnetic metal layer 1.

The spin-orbit torque wiring 20 may be directly connected to the first ferromagnetic metal layer 1 or may be connected via another layer.

The spin-orbit torque wiring 20 is made of a material which generates a pure spin current by the spin Hall effect when a current flows. As such a material, it is sufficient if the pure spin current is generated in the spin-orbit torque wiring 20. Therefore, the material is not limited to a material consisting of a single element, but may be a material composed of a material constituted by a material from which a pure spin current is generated and a material constituted by a material which does not generate a pure spin current.

The spin Hall effect is a phenomenon in which a pure spin current is induced in a direction orthogonal to the current direction based on the spin orbit interaction when a current is passed through the material.

Figure 2:
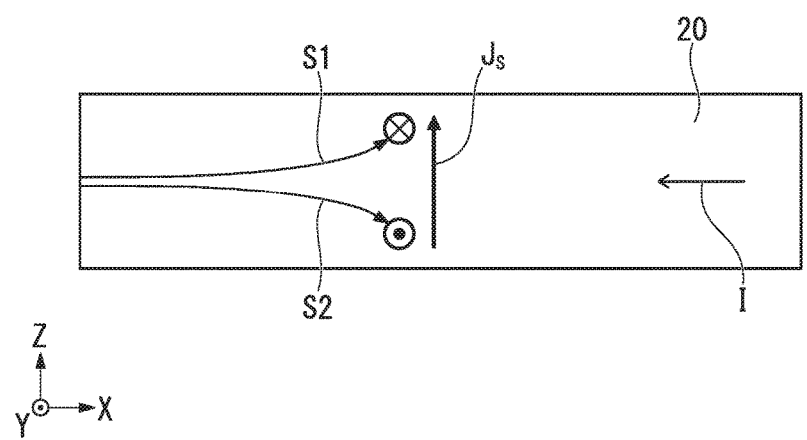
FIG. 2 is a schematic diagram for explaining a spin Hall effect.

FIG. 2 is a schematic diagram for explaining the spin Hall effect. FIG. 2 is a cross-sectional view of the spin-orbit torque wire 20 shown in FIG. 1 cut along the x direction. The mechanism by which the pure spin current is generated by the spin Hall effect will be described with reference to FIG. 2.

As shown in FIG. 2, when a current I is caused to flow in the extending direction of the spin-orbit torque wiring 20, the first spin S1 oriented on the back side of the page and the second spin S2 oriented on the near side of the page are each orthogonal to the current direction. The usual Hall effect and the spin Hall effect are common in that the movement (moving) electric charge (electron) is bent in the movement (moving) direction. However they differ in that the movement direction of the charged particles moving in the magnetic field are bent by receiving the Lorentz force in the usual Hall effect while the movement directions are bent by the movement of electrons (only the current flow) without the presence of a magnetic field in the spin Hall effect.

Since the number of electrons in the first spin S1 is equal to the number of electrons in the second spin S2 in the non-magnetic material (material which is not ferromagnetic material), the number of electrons in the first spin S1 going upward in the figure and the number of electrons in the second spin S2 going downward in the figure the same. Therefore, the current as a net flow of charge is zero. This spin current without current flow is called pure spin current in particular.

When an electric current is passed through the ferromagnetic material, it is the same in that the first spin S1 and the second spin S2 are bent in opposite directions. On the other hand, it differs in the ferromagnetic material in that either one of the first spin S1 and the second spin S2 outnumbers the other. As a result, a net flow of electric charge occurs (voltage is generated). Therefore, as the material of the spin-orbit torque wiring 20, a material made of only a ferromagnetic material is not included.

Here, the flow of electrons in the first spin S1 is defined as $J_\uparrow$, the flow of electrons in the second spin S2 as $J_\downarrow$, and the spin current as $J_\downarrow$, it is defined by $J_S=J_\uparrow-J_\downarrow$. In FIG. 2, $J_S$ flows as an upward direction in the figure as a pure spin current. Here, $J_S$ is a flow of electrons with a polarizability of 100%.

In FIG. 1, when a ferromagnetic material is brought into contact with the upper surface of the spin-orbit torque wiring 20, the pure spin current flows into the ferromagnetic material and flows. That is, spin is injected into the magnetoresistance effect element 10.

The spin-orbit torque wiring 20 may include a nonmagnetic heavy metal. Here, the term "heavy metal" is used to mean a metal having a specific gravity equal to or higher than that of yttrium. The spin-orbit torque wiring 20 may be made of only a nonmagnetic heavy metal.

In this case, the nonmagnetic heavy metal is preferably a nonmagnetic metal having an atomic number of 39 or more and having d electrons or f electrons in the outermost shell. This is because such a nonmagnetic metal has a large spin orbit interaction causing the spin Hall effect. The spin-orbit torque wire 20 may be made of only nonmagnetic metal having atomic number 39 or more having d electron or f electron in the outermost shell.

Normally, when electric current is passed through metal, all the electrons move in the direction opposite to the current irrespective of the direction of the spin. Contrary to that, there is more the spin-orbit interaction in the nonmagnetic metal having a large atomic number with d electron or f electron in the outermost shell. Thus, the movement direction of electrons depends on the orientation of electron spin due to the spin Hall effect. Accordingly, the pure spin current $J_S$ is likely to occur.

In addition, the spin-orbit torque wiring 20 may contain impurities such as magnetic metal and heavy metal. The magnetic metal means a ferromagnetic metal or an antiferromagnetic metal. If a trace amount of impurities is contained in the nonmagnetic metal, the spin-orbit interaction is enhanced and the spin current generation efficiency with respect to the current flowing through the spin-orbit torque wiring 20 can be increased. The spin-orbit torque wiring 20 may be made of only an antiferromagnetic metal.

Spin-orbit interaction is caused by the inherent inner field of the spin-orbit torque wiring material. Thus, the pure spin current occurs even in nonmagnetic materials. When a trace amount of impurities is added to the spin-orbit torque wiring material, the spin current generation efficiency improves because the electron spins flowing through the magnetic metal itself are scattered. However, if the addition amount of the magnetic metal is excessively increased, the generated pure spin current is scattered by the added magnetic metal, and as a result, the action of decreasing the spin current becomes stronger. Therefore, the molar ratio of the added magnetic metal is preferably sufficiently smaller than the molar ratio of the main component of the pure spin generator in the spin-orbit torque wiring. As a rule of thumb, the molar ratio of the added magnetic metal is preferably 3% or less.

In addition, the spin-orbit torque wiring 20 may include a topological insulator. The spin-orbit torque wiring 20 may be formed only of the topological insulator. The topological insulator is a material in which the interior of the material is an insulator or a high resistance body, but a spin-polarized metallic state is generated on the surface thereof. In substances, there is something like the inner magnetic field called the spin-orbit interaction. Therefore, even if there is no external magnetic field, a new topological phase develops due to the effect of the spin-orbit interaction. This is the topological insulator, and it is possible to generate pure spin current with high efficiency by strong spin-orbital interaction and the breakage of inversion symmetry at the edge.

As the topological insulator, for example, SnTe, $Bi_{1.5}Sb_{0.5}Te_{1.7}Se_{1.3}$, $TlBiSe_2$, $Bi_2Te_3$, $(Bi_{1-x}Sb_x)_2Te_3$ and the like are preferable. These topological insulators are capable of generating spin current with high efficiency.

It is preferable that the thickness of the spin-orbit torque wiring 20 is twice or less of the spin diffusion length of the material constituting the spin-orbit torque wiring. If it is about twice the spin diffusion length, spin can maintain that information. That is, the spin generated at the interface between the interfacial distortion supply layer 30 and the spin-orbit torque interconnection 20, which will be described later, can also contribute to the magnetization rotation of the first ferromagnetic metal layer.

<Interfacial Distortion Supply Layer>

The interfacial distortion supply layer 30 is a layer which imparts distortion to the crystal structure of the crystal constituting the spin-orbit torque wire 20. The interfacial distortion supply layer 30 is provided on the surface of the spin-orbit torque wiring 20 on the side opposite to the magnetoresistance effect element 10. The interfacial distortion supply layer 30 is at least partially overlapped with the magnetoresistance effect element 10 when viewed from the z direction. The spin-orbit torque wiring 20 is heteroepitaxially grown with respect to the interfacial distortion supplying layer 30.

Figure 3:
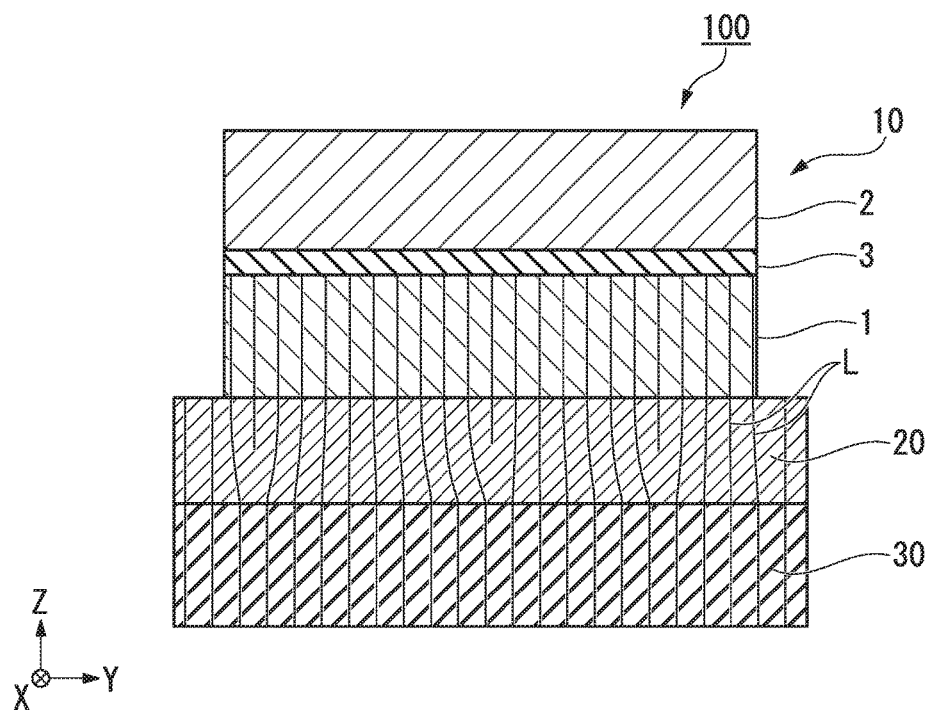
FIG. 3 is a schematic cross-sectional view of a spin-orbit torque magnetization rotational element according to an embodiment. The cross-sectional view is cut in the direction along with the y direction.

FIG. 3 is a drawing schematically showing the arrangement of atoms of the first ferromagnetic metal layer 1 and the interfacial distortion supply layer 30 of the magnetoresistance effect element 10 in the cross-sectional plane of the spin-orbit torque magnetization rotational element 100 along the y direction.

The crystal structures at the interface between the magnetoresistance effect element 10 and the spin-orbit torque wiring 20 are matched with each other. Therefore, it is possible to lattice-match the first ferromagnetic metal layer 1 and the nonmagnetic layer 3 of the magnetoresistance effect element 10 to increase the MR ratio of the magnetoresistance effect element 10.

On the other hand, at the interface between the interfacial distortion supply layer 30 and the spin-orbit torque interconnection 20, mismatching is introduced in their crystal structures. Therefore, in the spin-orbit torque wiring 20, the crystal structure is disturbed so as to alleviate this lattice distortion, and an internal field is formed in the spin-orbit torque wiring 20.

The Rashba effect causing SOT is a phenomenon caused by the breakage of space symmetry inside the interface and the spin orbital torque wiring 20. Therefore, if distortion is introduced at the interface and an inner field is formed in the spin-orbit torque wiring 20, the spin Hall effect increases. That is, the amount of spin injected into the first ferromagnetic metal layer 1 increases, and the magnetization of the first ferromagnetic metal layer 1 is easily rotated.

The interfacial distortion supply layer 30 preferably has a degree of the lattice mismatching with the spin-orbit torque wire 20 of 5% or more, more preferably 5% or more and 10% or less.

The "degree of lattice mismatching" is an index of the alignment state of two crystals at the crystal interface. As the degree of lattice mismatch increases, the crystals of each other are not aligned, and the crystal lattices are distorted from each other at the crystal interface. In general, it is said that if the degree of lattice mismatching is less than 5%, epitaxial growth matching the crystal structure of the underlying layer occurs even if it has a crystal interface.

The degree of lattice mismatching differs depending on the crystal structure of the interfacial distortion supply layer 30 and the spin-orbit torque wiring 20.

For example, when the interfacial distortion supply layer 30 has a NaCl structure, fcc structure and bcc structure can be selected as the crystal structure of the spin-orbit torque wiring 20 that crystal-grows while generating interfacial distortion.

Figure 4:
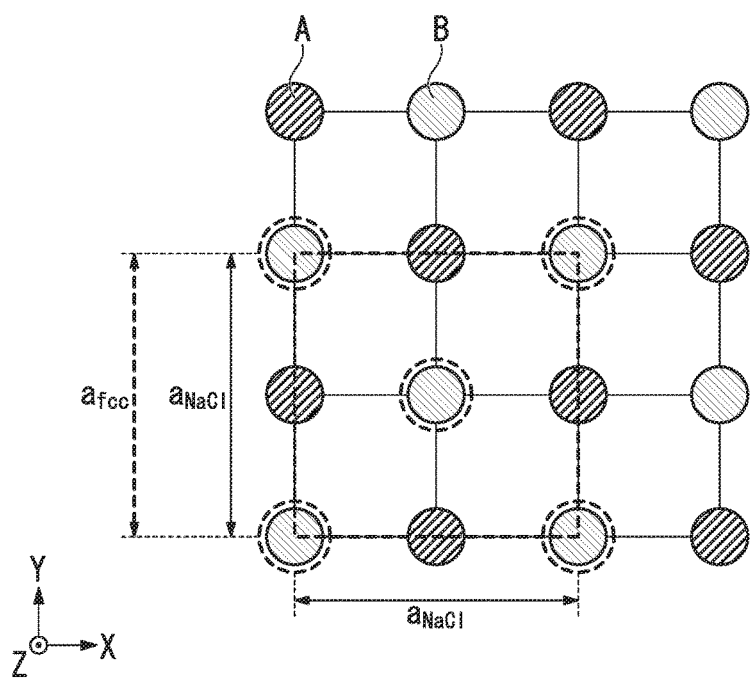
FIG. 4 is a diagram schematically showing a bonding interface between an interfacial distortion supply layer having a NaCl structure and a spin-orbit torque wiring.
Figure 5:
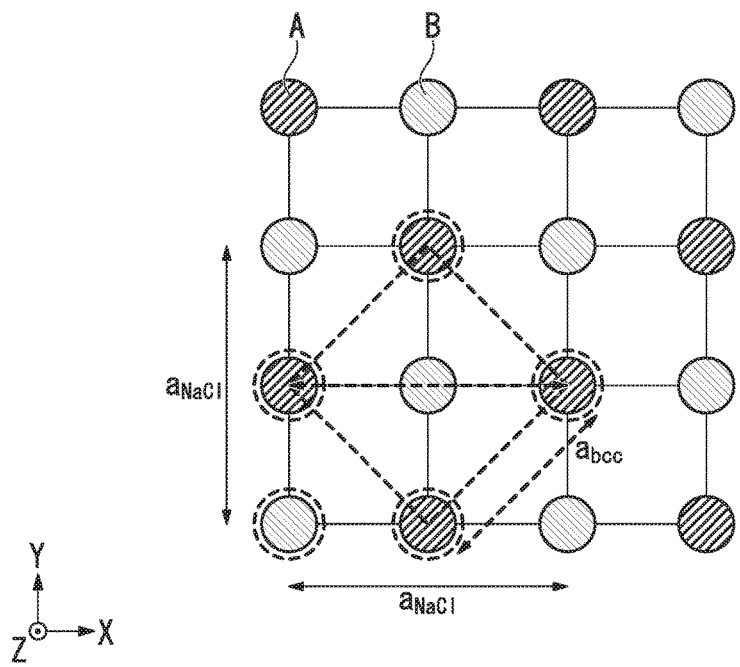
FIG. 5 is a view schematically showing a bonding interface between an interfacial distortion supply layer having a NaCl structure and a spin-orbit torque wiring.

FIGS. 4 and 5 are diagrams schematically showing bonding interfaces between the interfacial distortion supply layer 30 and the spin-orbit torque wiring 20. As shown in FIGS. 4 and 5, when the interfacial distortion supplying layer 30 has a NaCl structure, the A site and the B site are arranged so as to alternately form a square. That is, the lattice constant of the interfacial distortion supply layer 30 is $a_{NaCl}$.

As shown in FIG. 4, when the spin-orbit torque wiring 20 has the fcc structure, the fcc structure, which is a cubic crystal, grows on the NaCl structure which is a cubic crystal so that the sides of the unit lattices are aligned with each other. In FIG. 4, the unit lattice of the spin-orbit torque wire 20 is indicated by a dotted line. Such crystal growth is hereinafter referred to as "Cubic on cubic (ConC) growth."

In the ConC growth, the degree of lattice mismatching is expressed by the following formula (I) since the sides of the unit lattices are grown so as to be aligned with each other. In formula (1), $a_{fcc}$ is the lattice constant of the interfacial distortion supply layer 30 having the fcc structure.

[Formula 1]

$$\text{Degree of lattice mismatching} = \frac{|a_{NaCl} - a_{fcc}|}{a_{fcc}} \times 100[\%] \quad (1)$$

On the other hand, as shown in FIG. 5, when the spin-orbit torque wiring 20 has a bcc structure, a cubic bcc structure is formed on the cubic NaCl structure so that the unit lattice of each is rotated by 45° in the plane grown up. In FIG. 5, the unit lattice of the spin-orbit torque wire 20 is indicated by a dotted line. Such crystal growth is hereinafter referred to as "Rotate 45 (R45) growth."

In the R45 growth, the side of the unit lattice of the interfacial distortion supply layer 30 corresponds to the diagonal line of the unit lattice of the spin-orbit torque interconnection 20. Therefore, the degree of lattice mismatching is expressed by the following formula (2). In the formula (2), $a_{bcc}$ is the lattice constant of the interfacial distortion supply layer 30 having the bcc structure.

[Formula 2]

$$\text{Degree of lattice mismatching} = \frac{|a_{NaCl} - \sqrt{2}\, a_{bcc}|}{\sqrt{2}\, a_{bcc}} \times 100[\%] \quad (2)$$

As a material constituting the interfacial distortion supply layer 30 having a NaCl structure, magnesium oxide (MgO), iron oxide (FeO), vanadium oxide (VO), manganese oxide (MnO), cobalt oxide (CoO), nickel oxide (NiO) and the like can be named.

Platinum (Pt), palladium (Pd), gold (Au), and the like can be named as the spin-orbit torque wiring 20 having the fcc structure. Tantalum (Ta), tungsten (W), molybdenum (Mo), and the like can be named as the spin-orbit torque wiring 20 taking a bcc structure. For example, when iron (Fe) is used for the first ferromagnetic metal layer 1, any one of these materials is excellent in lattice matching with the first ferromagnetic metal layer 1.

Also, when the interfacial distortion supply layer 30 has a rutile structure, the degree of lattice mismatching can be expressed by the same equation as the NaCl structure. Even when the interfacial distortion supply layer 30 has a rutile structure, the fcc structure and the bcc structure can be selected as the crystal structure of the spin-orbit torque wiring 20, which crystal grows while generating interfacial distortion.

Figure 6:
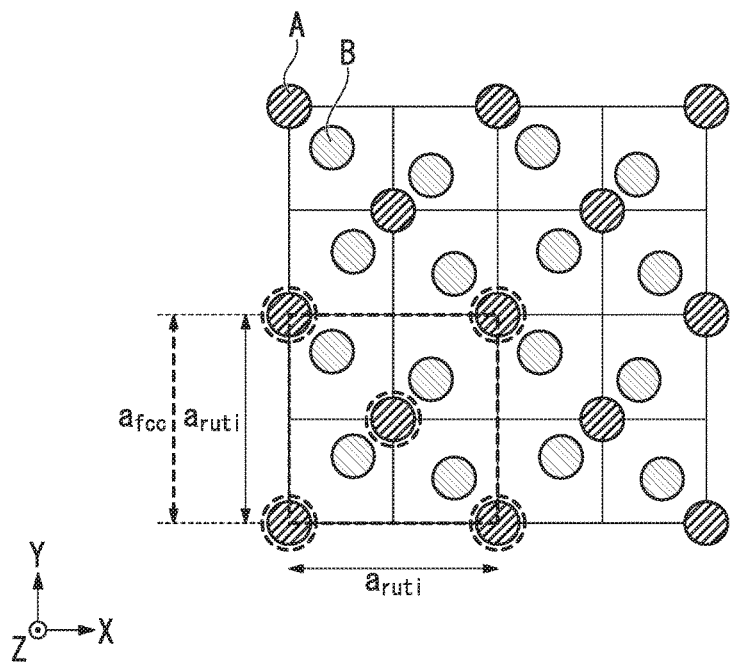
FIG. 6 is a diagram schematically showing a bonding interface between an interfacial distortion supply layer having a rutile structure and a spin-orbit torque wiring.
Figure 7:
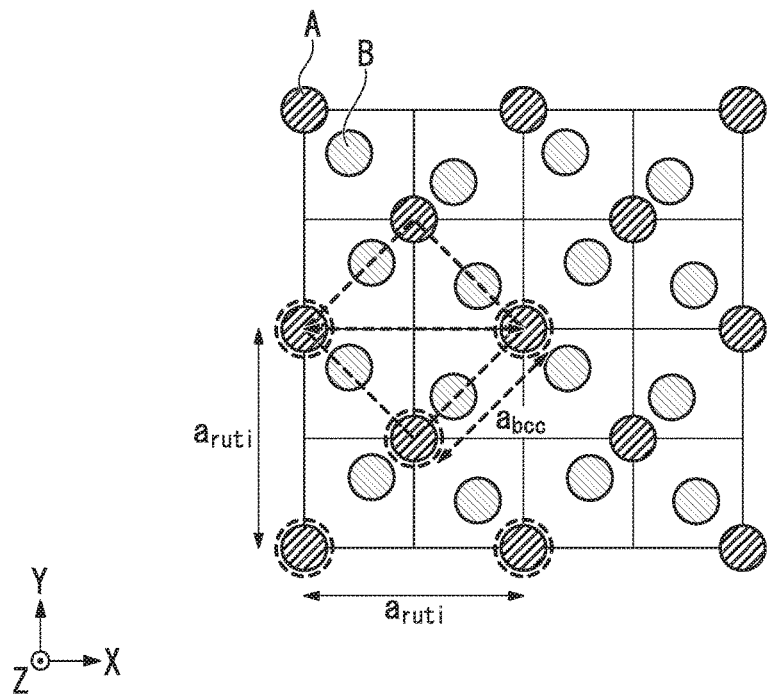
FIG. 7 is a view schematically showing a bonding interface between an interfacial distortion supply layer having a rutile structure and a spin-orbit torque wiring.

FIGS. 6 and 7 are diagrams schematically showing bonding interfaces between the interfacial distortion supplying layer 30 and the spin-orbit torque wiring 20. As shown in FIG. 6 and FIG. 7, when the interfacial distortion supply layer 30 has a rutile structure, one lattice unit is formed by the A sites located at each vertex and the center of the square as vied from the z direction; and the four B sites surrounding the central A site. That is, the lattice constant of the interfacial distortion supply layer 30 is $a_{ruti}$.

As shown in FIG. 6, when the spin-orbit torque wiring 20 has an fcc structure, the spin-orbit torque wiring 20 is the ConC grown on the interfacial distortion supplying layer 30. Therefore, when the lattice constant of the interfacial distortion supply layer 30 having the fcc structure is $a_{fcc}$, the following formula (3) is the formula showing the degree of lattice mismatching.

[Formula 3]

$$\text{Degree of lattice mismatching} = \frac{|a_{ruti} - a_{fcc}|}{a_{fcc}} \times 100[\%] \quad (3)$$

As shown in FIG. 7, when the spin-orbit torque wiring 20 has a bcc structure, the spin-orbit torque wiring 20 grows on the interfacial distortion supply layer 30 by R45.

Therefore, if the lattice constant of the interfacial distortion supply layer 30 having the bcc structure is $a_{bcc}$, the following formula (4) is an expression showing the degree of lattice mismatch.

[Formula 4]

$$\text{Degree of lattice mismatching} = \frac{|a_{ruti} - \sqrt{2}\, a_{bcc}|}{\sqrt{2}\, a_{bcc}} \times 100[\%] \quad (4)$$

Materials constituting the rutile structure interfacial distortion supplying layer 30 include titanium dioxide (TiO$_2$), manganese dioxide (MnO$_2$), ruthenium dioxide (RuO$_2$), tin dioxide (SnO$_2$), and the like. Among them, manganese dioxide (MnO$_2$) has an appropriate degree of lattice mismatching and can produce moderate lattice distortion.

Further, the interfacial distortion supplying layer 30 may have a corundum structure in some cases. As the crystal structure of the spin-orbit torque wiring 20 which crystal grows while generating interfacial distortion on the corundum structure, an fcc structure, a bcc structure, and an hcp structure can be selected.

Figure 8:
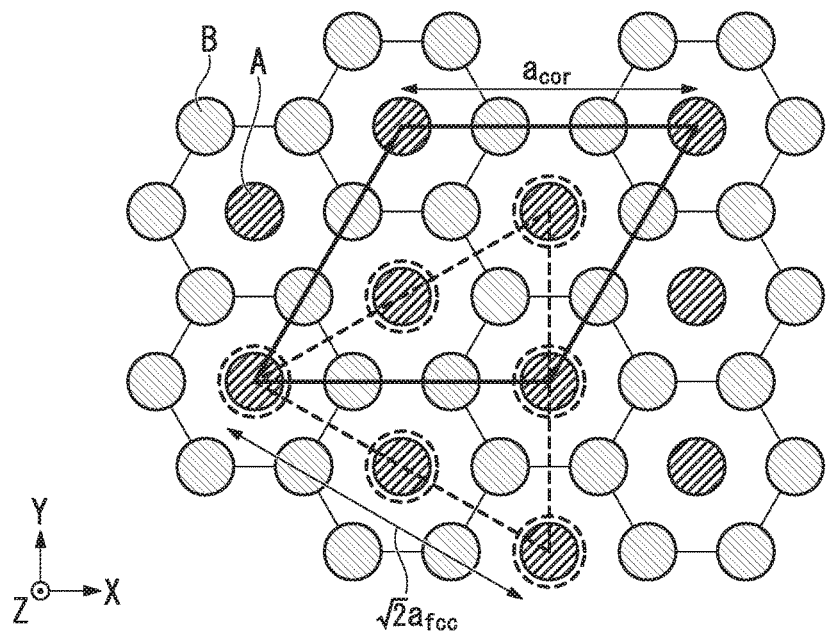
FIG. 8 is a view schematically showing a bonding interface between an interfacial distortion supply layer having a corundum structure and a spin-orbit torque wiring.
Figure 9:
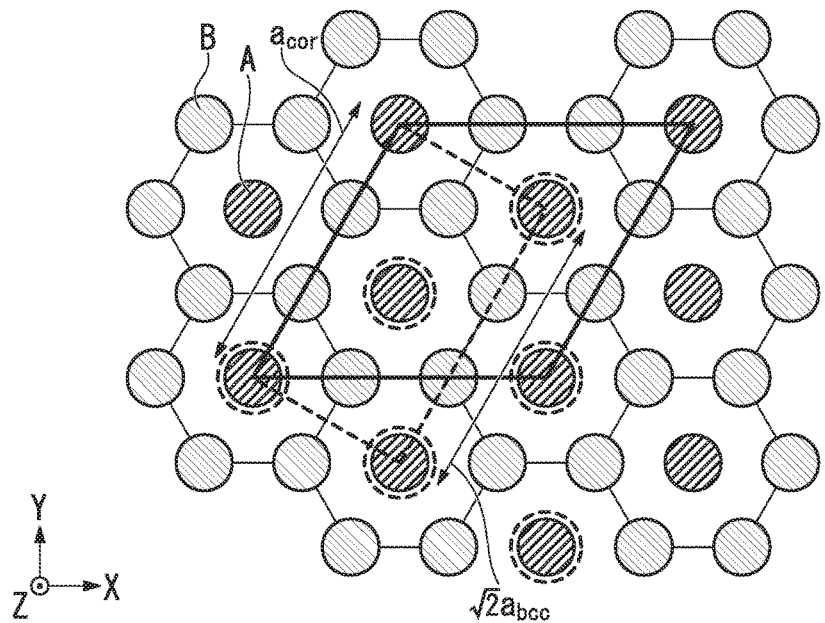
FIG. 9 is a view schematically showing a bonding interface between an interfacial distortion supply layer having a corundum structure and a spin-orbit torque wiring.
Figure 10:
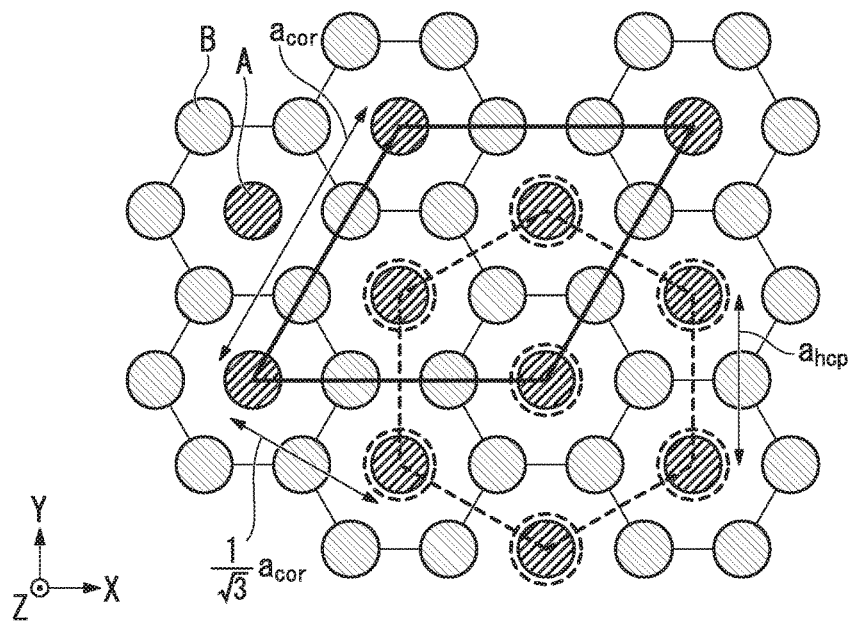
FIG. 10 is a diagram schematically showing a bonding interface between an interfacial distortion supply layer having a corundum structure and a spin-orbit torque wiring.

FIGS. 8, 9 and 10 are diagrams schematically showing bonding interfaces between the interfacial distortion supplying layer 30 and the spin-orbit torque wiring 20. As shown in FIGS. 8, 9 and 10, when the interfacial distortion supply layer 30 has a corundum structure, the unit lattice is a parallelogram connecting four A sites. That is, the lattice constant of the interfacial distortion supply layer 30 is $a_{cor}$.

As shown in FIG. 8, when the spin-orbit torque wiring 20 has the fcc structure, the spin-orbit torque wiring 20 grows in the <111> orientation on the interfacial distortion supplying layer 30. Therefore, the surface of the spin-orbit torque wire 20 that is aligned with the interfacial distortion supply layer 30 is the (111) plane.

In the (111) plane of the fcc structure, atoms arranged in a triangle shape are arranged in the closest packed state. One side of this triangle is equal to the length of the diagonal line of the unit cell $a_{fcc}$. Therefore, the correspondence relationship between the triangle in the (111) plane of the fcc structure and the structure having periodicity of the corundum structure is the degree of lattice mismatching. In the corundum structure, as shown in FIG. 8, a triangle connecting the A sites has periodicity. That is, the following formula (5) is a formula showing the degree of lattice mismatching.

[Formula 5]

$$\text{Degree of lattice mismatching} = \frac{\left|\frac{2}{\sqrt{3}} a_{cor} - \sqrt{2}\, a_{fcc}\right|}{\sqrt{2}\, a_{fcc}} \times 100[\%] \quad (5)$$

On the other hand, as shown in FIG. 9, when the spin-orbit torque wiring 20 has a bcc structure, the spin-orbit torque wiring 20 grows in the <110> orientation on the interfacial distortion supplying layer 30. Therefore, the surface of the spin-orbit torque wiring 20 that matches the interfacial distortion supplying layer 30 is the (110) plane.

In the (110) plane of the bcc structure, atoms are arranged in a rectangular shape. The long side of this rectangle is equal to the length of the diagonal line of the unit cell $a_{bcc}$. Therefore, the correspondence relationship between the rectangle in the (110) plane of the bcc structure and the structure having periodicity of the corundum structure is the degree of lattice mismatching. As shown in FIG. 9, in the corundum structure, a rectangle connecting four A sites having an A site in the center has periodicity. That is, the following formula (6) is an expression showing the degree of lattice mismatching.

[Formula 6]

$$\text{Degree of lattice mismatching} = \frac{|a_{cor} - \sqrt{2}\, a_{bcc}|}{\sqrt{2}\, a_{bcc}} \times 100[\%] \quad (6)$$

As shown in FIG. 10, when the spin-orbit torque wiring 20 has the hcp structure, the spin-orbit torque wiring 20 grows in the <0001> orientation on the interfacial distortion supplying layer 30. Therefore, the surface of the spin-orbit torque wiring 20 that matches the interfacial distortion supplying layer 30 is the (0001) plane.

In the (0001) plane of the hcp structure, atoms are arranged in a hexagonal closest packed state. One side of this hexagon is a unit cell $a_{hcp}$. On the other hand, a hexagon formed by joining A sites in the corundum structure has periodicity. Therefore, the degree of lattice mismatching is the degree of coincidence between the hexagon in the (0001) plane of the hcp structure and the hexagon with periodicity in the corundum structure. That is, the following formula (7) is an expression showing the degree of lattice mismatching.

[Formula 7]

$$\text{Degree of lattice mismatching} = \frac{\left|\frac{1}{\sqrt{3}} a_{cor} - a_{hcp}\right|}{a_{hcp}} \times 100[\%] \quad (7)$$

Examples of the spin-orbit torque wiring 20 having the hcp structure include titanium (Ti). As a material forming the interfacial distortion supply layer 30 having a corundum structure, aluminum oxide (Al$_2$O$_3$), di-titanium trioxide (Ti$_2$O$_3$), vanadium trioxide (V$_2$O$_3$), di-chromium trioxide (Cr$_2$O$_3$), di-iron trioxide (Fe$_2$O$_3$), gallium trioxide (Ga$_2$O$_3$), di-ruthenium trioxide (Rh$_2$O$_3$) and the like can be named.

In addition, the interfacial distortion supply layer 30 may have a spinel structure in some cases. As a crystal structure of the spin-orbit torque wiring 20 which crystal grows while generating interfacial distortion on the spinel structure, a bcc structure can be selected.

Figure 11:
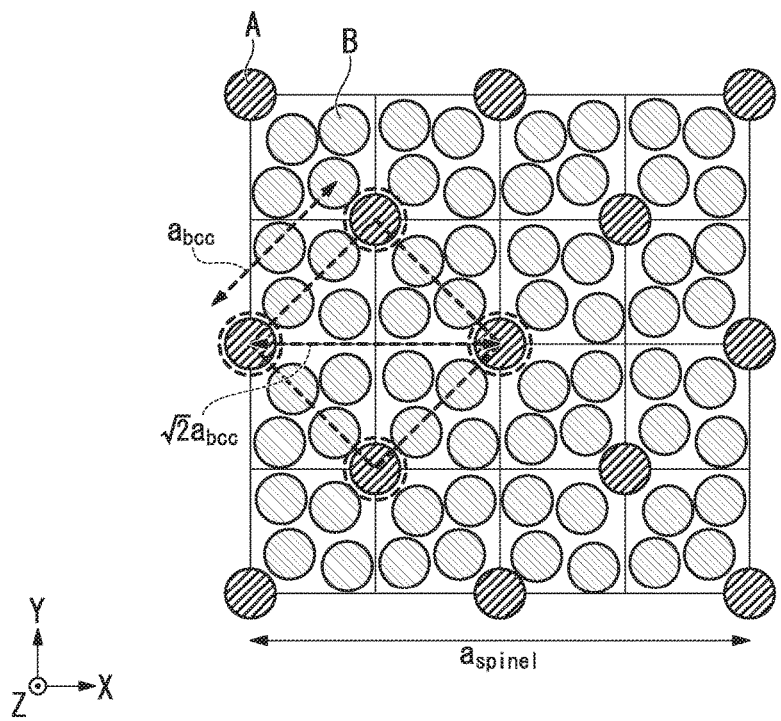
FIG. 11 is a diagram schematically showing a bonding interface between an interfacial distortion supply layer having a spinel structure and a spin-orbit torque wiring.

FIG. 11 is a view schematically showing a bonding interface between the interfacial distortion supplying layer 30 and the spin-orbit torque wiring 20. As shown in FIG. 11, when the interfacial distortion supply layer 30 has a spinel structure, the unit lattice is a quadrangle connecting four A sites. The lattice constant of the interfacial distortion supply layer 30 is $a_{spinel}$.

As shown in FIG. 11, when the spin-orbit torque wiring 20 has a bcc structure, the spin-orbit torque wiring 20 grows on the interfacial distortion supply layer 30 by R45. In the case of the spinel structure, since the unit lattice is formed by repeating squares of a quarter size of the unit lattice, the degree of matching between the square having a size of a quarter of the unit lattice and the interfacial distortion supply layer 30 is the degree of lattice mismatching. That is, the following formula (8) is the formula showing the degree of lattice mismatching.

[Formula 8]

$$\text{Degree of lattice mismatching} = \frac{\left|\frac{1}{2}a_{spinel} - \sqrt{2}\,a_{bcc}\right|}{\sqrt{2}\,a_{bcc}} \times 100[\%] \quad (8)$$

The interfacial distortion supply layer 30 is preferably an insulator. If the interfacial distortion supply layer 30 is an insulator, the current flowing through the spin-orbit torque wire 20 will not leak into the interfacial distortion supply layer 30. The pure spin current is caused by the current flowing in the spin-orbit torque wiring 20. By using the interfacial distortion supply layer 30 as an insulator, a sufficient current can be applied to the spin-orbit torque wire 20.

On the other hand, if the interfacial distortion supplying layer 30 has a thickness of 1 nm or less, the interfacial distortion supplying layer 30 may be a conductor. Here, the conductor means a material having a resistivity of 1 mΩcm or less. If the thickness of the interfacial distortion supply layer 30 is sufficiently thin, a large amount of current cannot flow through the interfacial distortion supply layer 30, and a sufficient amount of current can flow through the spin-orbit torque interconnection 20.

Examples of the conductor that can be used for the interfacial distortion supply layer 30 include nitrides and the like. For example, $Ta_2N$ having a hexagonal structure, TaN having a NaCl structure, or the like can be used. For example, the resistivity of $Ta_2N$ is 198 μΩcm (0.198 mΩcm).

As described above, in the spin-orbit torque magnetization rotational element according to the present embodiment, the interior distortion can be formed in the spin-orbit torque wire 20 by providing the interfacial distortion supply layer 30. That is, by the Rashba effect, the spin Hall effect can be increased and the amount of spin injected into the first ferromagnetic metal layer 1 can be increased. That is, even with a small reversal current density, sufficient spin can be supplied and the magnetization of the first ferromagnetic metal layer 1 can be rotated.

Such a spin-orbit torque magnetization rotational element 100 can be used for a magnetic memory, a high frequency magnetic device, and the like.

(Production Method)

The spin-orbit torque magnetization rotational element can be obtained by using film deposition technology such as sputtering method and shape processing technology such as photolithography.

First, an interfacial distortion supply layer and a spin-orbit torque interconnection are formed on a substrate to be a support. Metal constituting the spin-orbit torque wiring is formed by known film forming methods such as sputtering.

Next, the spin-orbit torque wiring is processed into a predetermined shape using a technique such as photolithography.

Then, portions other than the spin-orbit torque wiring are covered with an insulating film such as an oxide film. The exposed surfaces of the spin-orbit torque wiring and the insulating film are preferably polished by chemical mechanical polishing (CMP).

Next, a magnetoresistance effect element is fabricated. The magnetoresistance effect element can be manufactured by using known film forming methods such as sputtering. In the case where the magnetoresistance effect element is a TMR element, for example, the tunnel barrier layer is formed by: first, sputtering a metal thin made of divalent ions of magnesium, aluminum and multiple nonmagnetic element film having a thickness of about 0.4-2.0 nm on the first ferromagnetic metal layer; performing natural oxidation by plasma oxidation or oxygen introduction; and then heat treating. Examples of the film formation method include a sputtering method, a vapor deposition method, a laser ablation method, an MBE method, and the like.

It is preferable to perform annealing treatment on the obtained laminated film. The layer formed by reactive sputtering is amorphous and needs to be crystallized. For example, when Co—Fe—B is used as the ferromagnetic metal layer, a part of B is excluded to be crystallized by being annealed.

The magnetoresistance effect element 10 manufactured by annealing improves the MR ratio as compared with the magnetoresistive effect element 10 manufactured without annealing treatment. It is believed that the uniformity and the orientation of the crystal size of the tunnel barrier layer of the nonmagnetic layer 3 are improved by the annealing treatment.

Preferably, as the annealing treatment, heating is performed in an inert atmosphere such as Ar at a temperature of 300° C. or more and 500° C. or less for 5 minutes or more and 100 minutes or less. Then, it is heated at 100° C. or more and 500° C. or less for 1 hour or more and 10 hours or less in a state where a magnetic field of 2 kOe or more and 10 kOe or less is applied.

As a method of forming the magnetoresistance effect element into a predetermined shape, processing methods such as photolithography can be used. First, after laminating the magnetoresistive effect element, a resist is applied to the surface of the magnetoresistance effect element on the side opposite to the spin-orbit torque wiring. Then, a predetermined portion of the resist is cured, and the unnecessary portion of the resist is removed. The portion where the resist is cured becomes the protective film of the magnetoresistive effect element. The portion where the resist is cured matches with the shape of the finally obtained magnetoresistive effect element.

Then, processing such as ion milling and reactive ion etching (RIE) is performed on the surface on which the protective film is formed. The portion where the protective film is not formed is removed, and a magnetoresistance effect element of a predetermined shape is obtained.

The present invention is not necessarily limited to the configuration and manufacturing method of the spin-orbit torque magnetization rotational element according to the above-described embodiment, and various modifications can be made within a scope not deviating from the aspects of the present invention.

For example, the spin-orbit torque magnetization rotational element does not necessarily have the magnetoresistive effect element 10, and the ferromagnetic metal layer alone may be provided on the spin-orbit torque wire 20.

Figure 12:
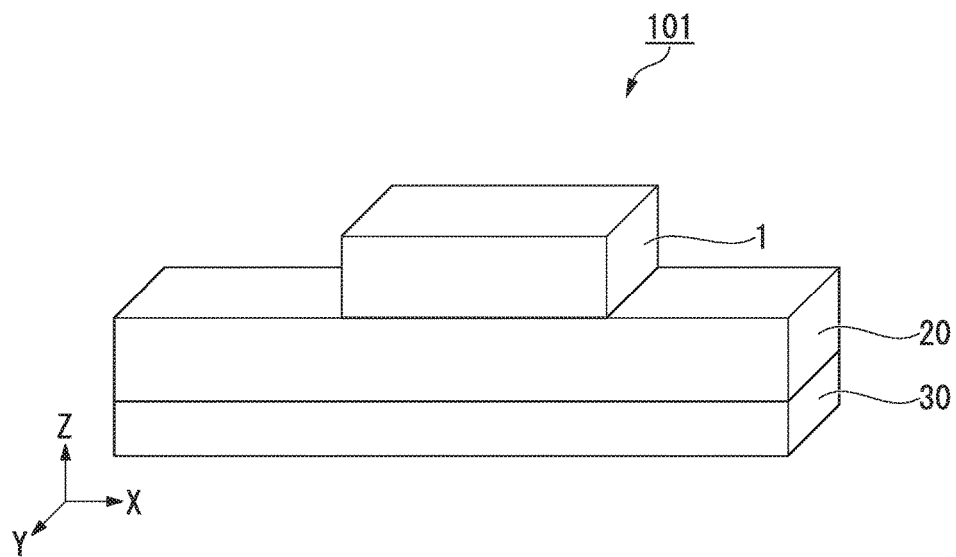
FIG. 12 is a schematic view of another example of the spin-orbit torque magnetization rotational element according to the present embodiment.

FIG. 12 is a diagram schematically showing another example of the spin-orbit torque magnetization rotational element according to the first embodiment. The spin-orbit torque magnetization rotational element 101 shown in FIG. 12 has a first ferromagnetic metal layer 1 whose magnetization direction is configured to be changed, a spin-orbit torque wiring 20, and an interfacial distortion supply layer 30.

The magnetization of the first ferromagnetic metal layer 1 of the spin-orbit torque magnetization rotational element 101 is rotated by SOT caused by the pure spin current supplied from the spin-orbit torque wiring 20. Further, since the interfacial distortion supplying layer 30 is provided on the surface of the spin-orbit torque wiring 20 on the side opposite to the first ferromagnetic metal layer 1, more spin can be injected into the first ferromagnetic metal layer 1. That is, the magnetization of the first ferromagnetic metal layer 1 can be inverted with a small reversal current density.

The spin-orbit torque magnetization rotational element 101 as shown in FIG. 12 can be used as a magneto-optical element utilizing Kerr effect or Faraday effect.

Further, the interfacial distortion supply layer may not be provided on the side opposite to the ferromagnetic metal layer of the spin-orbit torque wiring. For example, if the direction of magnetization of the first ferromagnetic metal layer may be distorted, an interfacial distortion supply layer may be provided between the spin-orbit torque wiring and the first ferromagnetic metal layer. Alternatively, the interface between the spin-orbit torque wiring and the first ferromagnetic metal layer may be merely distorted without providing the interfacial distortion supplying layer. However, in this case, the MR ratio of the magneto-optical effect such as the Kerr effect and the magnetoresistive effect element decreases.

EXAMPLES (Calculation of Degree of Lattice Mismatching)

The material used for the spin-orbit torque wiring and the material used for the interfacial distortion supply layer were respectively changed to determine the degree of lattice mismatching for each material.

The lattice constant of each material was obtained by actual measurement and calculation. For the calculation, it was obtained using the site of "AtomWork" (Search on October 13, Heisei 8, URL: http://crystdb.nims.go.jp/) managed by National Institute for Materials Science and Technology, Japan. Note that the site of "Atom Work" is prepared based on Inorganic Materials Database for Exploring the Nature of Material. Jpn. J. Appl. Phys. 50 (2011) 11 RH 02 (Yibin Xu, Masayoshi Yamazaki, and Pierre Villars).

First, a material having a NaCl structure was selected as an interfacial distortion supply layer. The spin orbital torque wiring for this was changed, and the degree of lattice mismatching of each was obtained based on the formulae (1) and (2). It was assumed that ConC growth occurred when the spin-orbit torque wiring had the fcc structure and R45 growth occurred in the case of the bcc structure. The results are shown in Table 1.

TABLE 1

| | | Degree of lattice mismatching Spin-orbit torque wiring | | | | | |
|---|---|---|---|---|---|---|---|
| | | fcc | | | bcc | | |
| Interfacial distortion supply layer | | Pt | Pd | Au | Ta | W | Mo |
| Material | Lattice constant (nm) | 0.392 | 0.389 | 0.408 | 0.330 | 0.316 | 0.315 |
| MgO | 0.422 | 7.65% | 8.48% | 3.43% | 9.58% | 5.57% | 5.27% |
| VO | 0.408 | 4.03% | 4.83% | 0.05% | 12.6% | 8.75% | 8.46% |
| MnO | 0.451 | 15.0% | 15.9% | 10.5% | 3.40% | 0.87% | 1.19% |
| FeO | 0.431 | 9.97% | 10.8% | 5.66% | 7.63% | 3.54% | 3.23% |
| CoO | 0.426 | 8.67% | 9.51% | 4.41% | 8.72% | 4.67% | 4.37% |
| NiO | 0.418 | 6.63% | 7.46% | 2.45% | 10.4% | 6.46% | 6.17% |
| PdO | 0.565 | 44.1% | 45.2% | 38.5% | 21.1% | 26.4% | 26.8% |
| TaN | 0.433 | 10.5% | 73.1% | 6.13% | 7.22% | 3.11% | 2.80% |

Next, a material having a rutile structure was selected as the interfacial distortion supply layer. The spin orbital torque wiring for this was changed, and the degree of lattice mismatching of each was obtained based on the formulae (3) and (4). It was assumed that ConC growth occurred when the spin-orbit torque wiring had the fcc structure and R45 growth occurred in the case of the bcc structure. The results are shown in Table 2.

TABLE 2

| | | Degree of lattice mismatching Spin-orbit torque wiring | | | | | |
|---|---|---|---|---|---|---|---|
| | | fcc | | | bcc | | |
| Interfacial distortion supply layer | | Pt | Pd | Au | Ta | W | Mo |
| Material | Lattice constant (nm) | 0.392 | 0.389 | 0.408 | 0.330 | 0.316 | 0.315 |
| $TiO_2$ | 0.459 | 17.2% | 18.1% | 12.6% | 1.58% | 2.78% | 3.10% |
| $MnO_2$ | 0.440 | 12.3% | 13.1% | 7.88% | 5.70% | 1.52% | 1.21% |

TABLE 2-continued

| | | Degree of lattice mismatching Spin-orbit torque wiring | | | | | |
|---|---|---|---|---|---|---|---|
| | | fcc | | | bcc | | |
| Interfacial distortion supply layer | | Pt | Pd | Au | Ta | W | Mo |
| Material | Lattice constant (nm) | 0.392 | 0.389 | 0.408 | 0.330 | 0.316 | 0.315 |
| RuO$_2$ | 0.449 | 14.6% | 15.5% | 10.1% | 3.77% | 0.49% | 0.81% |
| SnO$_2$ | 0.474 | 20.91% | 21.8% | 16.2% | | | |

Next, a material having a corundum structure was selected as the interfacial distortion supply layer. The spin orbital torque wiring for this was changed, and the degree of lattice mismatching of each was obtained based on the formulae (5), (6) and (7). The results are shown in Table 3.

TABLE 3

| | | Degree of lattice mismatching Spin-orbit torque wiring | | | | | | |
|---|---|---|---|---|---|---|---|---|
| Interfacial distortion supply layer | | fcc | | | bcc | | | hcp |
| Material | Lattice constant (nm) | Pt 0.392 | Pd 0.389 | Au 0.408 | Ta 0.330 | W 0.316 | Mo 0.315 | Ti 0.295 |
| Al$_2$O$_3$ | 0.476 | 0.88% | 0.11% | 4.76% | 1.97% | 6.49% | 6.83% | 6.86% |
| Ti$_2$O$_3$ | 0.515 | 7.19% | 8.01% | 2.98% | 10.3% | 15.2% | 15.5% | 0.71% |
| V$_2$O$_3$ | 0.495 | 3.10% | 3.90% | 0.94% | 6.07% | 10.8% | 11.1% | 3.12% |
| Cr$_2$O$_3$ | 0.495 | 3.14% | 3.93% | 0.91% | 6.10% | 10.8% | 11.2% | 3.09% |
| Fe$_2$O$_3$ | 0.505 | 5.25% | 6.06% | 1.12% | 8.27% | 13.1% | 13.4% | 1.11% |
| Ga$_2$O$_3$ | 0.498 | 3.71% | 4.51% | 0.36% | 6.69% | 11.4% | 11.8% | 2.56% |
| Rh$_2$O$_3$ | 0.513 | 6.79% | 7.61% | 2.60% | 9.86% | 14.7% | 15.1% | 0.34% |

Subsequently, a material having a spinel structure, a wurtzite structure, and a hexagonal structure was selected as the interfacial distortion supply layer. The spin-orbit torque wiring for this was changed. Regarding the spinel structure, the degree of lattice mismatch was determined based on the formula (8).

The wurtzite structure and the hexagonal structure were arranged in a hexagonal shape of atoms in plan views. Therefore, degrees of lattice mismatching were obtained based on the premise that their lattice constants; and one side of a hexagon having a periodic structure in the (111) plane of the fcc structure, one side of a hexagon having a periodic structure in the (110) plane of the bcc structure, or the lattice constant of the hcp structure, match. The results are shown in Table 4.

TABLE 4

| | | | Degree of lattice mismatching Spin-orbit torque wiring | | | | | | |
|---|---|---|---|---|---|---|---|---|---|
| Interfacial distortion supply layer | | | fcc | | | bcc | | | hcp |
| Material | Crystal structure | Lattice constant (nm) | Pt 0.392 | Pd 0.389 | Au 0.408 | Ta 0.330 | W 0.316 | Mo 0.315 | Ti 0.295 |
| MgAl$_2$O$_4$ | Spinel | 0.404 | 3.06% | 3.86% | 0.98% | 13.43% | 9.60% | 9.31% | — |
| ZnO | Wurtzite structure | 0.325 | 17.4% | 18.3% | 12.8% | 30.3% | 27.2% | 27.0% | 10.3% |
| Ta$_2$N | Hexagonal | 0.305 | 10.0% | 10.9% | 5.72% | 34.7% | 31.8% | 31.5% | 3.39% |

(Measurement of Inversion Current Density)

The reversal current densities of several combinations were measured from combinations of material types shown in Tables 1 to 4. The reversal current density was obtained by dividing the current when the resistance value of the magnetoresistance effect element changed by the cross sectional area obtained by cutting the spin-orbit torque wiring in the y direction. The reversal current density was obtained as the average value of the absolute values of the value obtained when the magnetization changed from the parallel state to the antiparallel state; and the value obtained when the magnetization changing from the antiparallel state to the parallel state.

The current was supplied by connecting a direct current source to both ends of the spin-orbit torque wiring. The current was a pulse current with a pulse width of 0.5 second. The current amount was measured with a DC ammeter connected to both ends of the spin-orbit torque wire. The change in the resistance value of the magnetoresistance effect element was measured by the four terminal method with the spin-orbit torque wiring as the lower electrode for the magnetoresistance effect element and the upper electrode on the opposite side to the spin-orbit torque wiring. A DC current source and a DC voltmeter were connected between the upper electrode and the lower electrode.

A spin-orbit torque magnetization rotational element for measuring the reversal current density had the following structure.

First, an interfacial distortion supply layer was grown to a thickness of 20 nm on a substrate. When the interfacial distortion supply layer was a conductor, TaN or Ta$_2$N with varying film thicknesses were grown. The substrate was a single crystal substrate so that the interfacial distortion supply layer could be epitaxially grown. As shown in Table 5, the kind of the single crystal was selected according to the material used for the interfacial distortion supply layer.

Next, a material constituting the spin-orbit torque wiring was formed to a thickness of 10 nm on the interfacial distortion supply layer. After that, the film formed by photolithography was processed into a rectangular shape with a width of 200 nm and a length of 1000 nm, and a spin-orbit torque wiring was produced. SiO$_2$ was formed as an insulator on the part removed by photolithography, and the flat surface was prepared by CMP polishing the spin-orbit torque wiring and the insulator.

Subsequently, Fe of 0.9 nm thickness as the first ferromagnetic metal layer; MgO of 1.6 nm thickness as the nonmagnetic layer; CoFeB of 1.3 nm thickness as the second ferromagnetic metal layer; and Ru of 3 nm thickness and Ta of 5 nm thickness as the cap layers, were deposited in the order on the above-prepared flat surface. Thereafter, using a photolithography and Ar ion milling, a columnar magnetoresistance effect element having a diameter of 100 nm was fabricated.

Several materials of the interfacial distortion supply layer and the spin-orbit torque wiring of the spin-orbit torque magnetization rotational element were selected from combinations shown in Tables 1 to 4 and the reversal current density was measured therein. The measured results are shown in Table 5. In addition, as Comparative Example 1, the reversal current density was measured in the case where there was no interfacial distortion supply layer. The measured result is shown in Table 5 at the same time.

TABLE 5

| | | Interfacial distortion supply layer | | Spin-orbit torque wiring | | Degree of lattice matching | Reversal current density [A/cm$^2$] |
|---|---|---|---|---|---|---|---|
| | Single crystal substrate | Material | Crystal structure | Material | Crystal structure | | |
| Example 1 | MgO | MgO | NaCl | Pt | fcc | 7.7% | 7.1 × 10$^6$ |
| Example 2 | | MgO | | Pd | fcc | 8.5% | 9.5 × 10$^6$ |
| Example 3 | | NiO | | Pt | fcc | 6.6% | 8.2 × 10$^6$ |
| Example 4 | | MgO | | Ta | bcc | 9.6% | 6.9 × 10$^6$ |
| Example 5 | | MgO | | W | bcc | 5.6% | 8.6 × 10$^6$ |
| Example 6 | | MnO | | Pt | fcc | 15.0% | 1.1 × 10$^7$ |
| Example 7 | | MnO | | W | bcc | 0.9% | 2.2 × 10$^7$ |
| Example 8 | | TaN (0.5 nm) | | Ta | bcc | 7.2% | 8.2 × 10$^6$ |
| Example 9 | | TaN (0.8 nm) | | Ta | bcc | 7.2% | 8.0 × 10$^6$ |
| Example 10 | | TaN (1.0 nm) | | Ta | bcc | 7.2% | 8.8 × 10$^6$ |
| Example 11 | | TaN (1.2 nm) | | Ta | bcc | 7.2% | 7.3 × 10$^7$ |
| Example 12 | | TaN (1.5 nm) | | Ta | bcc | 7.2% | 1.0 × 10$^8$ |
| Example 13 | TiO2 | MnO$_2$ | Rutile | Au | fcc | 7.9% | 8.9 × 10$^6$ |
| Example 14 | | RuO$_2$ | | Pt | fcc | 14.6% | 1.9 × 10$^7$ |
| Example 15 | c-Al$_2$O$_3$ | Rh$_2$O$_3$ | Corundum | Pt | fcc | 6.8% | 8.0 × 10$^6$ |
| Example 16 | | Al$_2$O$_3$ | | W | bcc | 6.5% | 7.0 × 10$^6$ |
| Example 17 | | Al$_2$O$_3$ | | Ti | hcp | 6.9% | 8.2 × 10$^6$ |
| Example 18 | | Al$_2$O$_3$ | | W | bcc | 17.3% | 1.6 × 10$^6$ |
| Example 19 | | Ta$_2$N | Hexagonal | Au | fcc | 5.7% | 1.9 × 10$^7$ |
| Example 20 | MgO | MgAl$_2$O$_3$ | Spinel | W | bcc | 9.6% | 6.2 × 10$^6$ |
| Example 21 | GaN | ZnO | Wurtzite | Pt | fcc | 17.3% | 1.3 × 10$^7$ |
| Example 22 | | Ti$_2$O$_3$ | | W | bcc | 15.2% | 1.2 × 10$^7$ |
| Comparative Example 1 | Si substrate with thermal oxide film | — | | Pt | fcc | — | 1.3 × 10$^8$ |

As shown in Table 5, in each of Examples 1 to 22 in which the interfacial distortion supply layer was introduced, the reversal current density was smaller than that of Comparative Example 1 having no interfacial distortion supply layer. That is, by introducing the interfacial distortion supply layer, the magnetization of the first ferromagnetic metal layer is easily rotated. This tendency was confirmed irrespective of the crystal structure of the interfacial distortion supply layer and the spin-orbit torque wiring.

Further, as shown in Examples 6, 14, 18, 21 and 22, in the case where the degree of lattice mismatching was too high (lattice was greatly distorted), the reversal current density was higher than that of Example 1. In addition, as shown in Example 7, even when the degree of lattice mismatching was too low (lattice was relatively matched), the reversal current density was higher than that of Example 1. That is, it is preferable that the degree of lattice mismatching is in the range of 5% or more and 10% or less.

In addition, in comparison among Examples 8 to 12, the reversing current density became high around the point where the thickness of the conductive TaN exceeded 1.0 nm. It is interpreted that the amount of current flowing through the interfacial distortion supply layer was increased as the thickness of the interfacial distortion supply layer was increased; and the amount of current flowing through the spin-orbit torque wiring was decreased relatively.

(Measurement of Crystal Structure)

Since the crystal structure could not be confirmed when the spin-orbit torque wiring and the magnetoresistance effect element were formed on the interfacial distortion supply layer, the crystal structure of the interfacial distortion supply layer was confirmed by separately preparing samples.

As the samples for confirming the crystal structure, samples, in which a interfacial distortion supply layer in 20 nm thickness and aTa layer in 10 nm thickness were laminated in the order on each single crystal substrate shown in Table 5, were prepared. The X-ray diffraction (XRD) of the samples was measured and the crystal structures were measured. XRD is a direct measurement (out of plane XRD) and in-plane measurement (in plane XRD).

At the same time, atomic arrangement was confirmed directly using a transmission electron microscope (TEM). In the transmission electron microscope (TEM) image, atoms constituting crystals of the spin-orbit torque wiring and the interfacial distortion supply layer can be confirmed. It was confirmed that hetero-epitaxial growth was made from the arrangement of atoms.

Since the hetero-epitaxial growth was made, it was demonstrated that the lattice of the spin orbital torque wiring and the interfacial distortion supply layer were deviated from the theoretical lattice constant and distorted. Although it is difficult to quantitatively judge the degree of distortion from the TEM image, crystal distortion at the interface was confirmed by judging based on lattice constant difference between the spin-orbit torque wiring and the interfacial distortion supply layer. Furthermore, in the image obtained by inverse Fourier transformation leaving only the spot of atomic arrangement in the direction perpendicular to the plane to the spot image to the spot image obtained by Fourier transformation of the TEM image, images, in which lines are connected between the spin-orbit torque wiring and the interfacial distortion supply layer when atoms are continuously arranged, are obtained. However, in the TEM image obtained in this example, it was confirmed that the line was disconnected at the part of the interface between the spin-orbit torque wiring and the interfacial distortion supply layer. Accordingly, it was confirmed this is a misfit dislocation proving the presence of the distortion.

While preferred embodiments of the invention have been described and illustrated above, it should be understood that these are exemplary of the invention and are not to be considered as limiting. Additions, omissions, substitutions, and other modifications can be made without departing from the spirit or scope of the present invention. Accordingly, the invention is not to be considered as being limited by the foregoing description, and is only limited by the scope of the appended claims.

EXPLANATION OF REFERENCES

1: First ferromagnetic metal layer
2: Second ferromagnetic metal layer
3: Nonmagnetic layer
10: Magnetoresistance effect element
20: Spin-orbit torque wiring
30: Interfacial distortion supply layer
100, 101: Spin-orbit torque magnetization rotational element
S1: First spin
S2: Second spin
I: Current
Js: Pure spin current
A: A site
B: B site

What is claimed is:

1. A spin-orbit torque magnetization rotational element comprising:
    a ferromagnetic metal layer, a magnetization direction of which is configured to be changed;
    a spin-orbit torque wiring bonded to the ferromagnetic metal layer; and
    an interfacial distortion supply layer bonded to a surface of the spin-orbit torque wiring on a side opposite to the ferromagnetic metal layer,
    wherein a degree of lattice mismatching between the spin-orbit torque wiring and the interfacial distortion supply layer is 5% or more.

2. The spin-orbit torque magnetization rotational element according to claim 1, wherein
    the spin-orbit torque wiring has an fcc crystal structure, and
    the interfacial distortion supply layer has any one of a NaCl structure, a corundum structure and a rutile structure.

3. The spin-orbit torque magnetization rotational element according to claim 1, wherein
    the spin-orbit torque wiring has a bcc crystal structure, and
    the interfacial distortion supply layer has any one of a NaCl structure, a corundum structure, a rutile structure and a spinel structure.

4. The spin-orbit torque magnetization rotational element according to claim 1, wherein
    the spin-orbit torque wiring has a hcp structure, and
    the interfacial distortion supply layer has a corundum structure.

5. The spin-orbit torque magnetization rotational element according to claim 1, wherein a thickness of the spin-orbit torque wiring is twice or less of a spin diffusion length of a material constituting the spin-orbit wiring.

6. The spin-orbit torque magnetization rotational element according to claim 5, wherein the interfacial distortion supply layer is a conductor having a thickness of 1 nm or less.

7. The spin-orbit torque magnetization rotational element according to claim 1, further comprising, a nonmagnetic layer and a fixed layer, in which a magnetization direction is fixed, on a surface of the ferromagnetic metal layer on a side opposite to the spin-orbit torque wiring.

8. A magnetic memory using the spin-orbit torque magnetization rotational element according to claim 1.

9. The spin-orbit torque magnetization rotational element according to claim 1, wherein the interfacial distortion supply layer is an insulator.

10. The spin-orbit torque magnetization rotational element according to claim 1, wherein the interfacial distortion supply layer is a conductor having a thickness of 1 nm or less.

11. A spin-orbit torque magnetization rotational element comprising:
    a ferromagnetic metal layer, a magnetization direction of which is configured to be changed;
    a spin-orbit torque wiring bonded to the ferromagnetic metal layer; and
    an interfacial distortion supply layer bonded to a surface of the spin-orbit torque wiring on a side opposite to the ferromagnetic metal layer,
    wherein a degree of lattice mismatching between the spin-orbit torque wiring and the interfacial distortion supply layer is 5% or more and 10% or less.

12. The spin-orbit torque magnetization rotational element according to claim 11, wherein
the spin-orbit torque wiring has an fcc crystal structure, and
the interfacial distortion supply layer has any one of a NaCl structure, a corundum structure and a rutile structure.

13. The spin-orbit torque magnetization rotational element according to claim 11, wherein
the spin-orbit torque wiring has a bcc crystal structure, and
the interfacial distortion supply layer has any one of a NaCl structure, a corundum structure, a rutile structure and a spinel structure.

14. The spin-orbit torque magnetization rotational element according to claim 11, wherein
the spin-orbit torque wiring has a hcp structure, and
the interfacial distortion supply layer has a corundum structure.

15. The spin-orbit torque magnetization rotational element according to claim 11, wherein a thickness of the spin-orbit torque wiring is twice or less of a spin diffusion length of a material constituting the spin-orbit wiring.

16. The spin-orbit torque magnetization rotational element according to claim 11, wherein the interfacial distortion supply layer is an insulator.

17. The spin-orbit torque magnetization rotational element according to claim 11, wherein the interfacial distortion supply layer is a conductor having a thickness of 1 nm or less.

18. The spin-orbit torque magnetization rotational element according to claim 11, further comprising, a nonmagnetic layer and a fixed layer, in which a magnetization direction is fixed, on a surface of the ferromagnetic metal layer on a side opposite to the spin-orbit torque wiring.

19. A spin-orbit torque magnetization rotational element comprising:
a ferromagnetic metal layer, a magnetization direction of which is configured to be changed;
a spin-orbit torque wiring bonded to the ferromagnetic metal layer; and
an interfacial distortion supply layer bonded to a surface of the spin-orbit torque wiring on a side opposite to the ferromagnetic metal layer,
wherein the interfacial distortion supply layer is an insulator.

20. The spin-orbit torque magnetization rotational element according to claim 19, further comprising, a nonmagnetic layer and a fixed layer, in which a magnetization direction is fixed, on a surface of the ferromagnetic metal layer on a side opposite to the spin-orbit torque wiring.

21. A spin-orbit torque magnetization rotational element comprising:
a ferromagnetic metal layer, a magnetization direction of which is configured to be changed;
a spin-orbit torque wiring bonded to the ferromagnetic metal layer; and
an interfacial distortion supply layer bonded to a surface of the spin-orbit torque wiring on a side opposite to the ferromagnetic metal layer,
wherein the interfacial distortion supply layer is a conductor having a thickness of 1 nm or less.

22. The spin-orbit torque magnetization rotational element according to claim 21, further comprising, a nonmagnetic layer and a fixed layer, in which a magnetization direction is fixed, on a surface of the ferromagnetic metal layer on a side opposite to the spin-orbit torque wiring.

* * * * *